United States Patent [19]

Bruce et al.

[11] Patent Number: 5,760,483

[45] Date of Patent: Jun. 2, 1998

[54] METHOD FOR IMPROVING VISIBILITY OF ALIGNMENT TARGETS IN SEMICONDUCTOR PROCESSING

[75] Inventors: James A. Bruce, Williston; Steven John Holmes, Milton; Robert K. Leidy, Burlington, all of Vt.

[73] Assignee: International. Business Machines Corporation, Armonk, N.Y.

[21] Appl. No.: 772,709

[22] Filed: Dec. 23, 1996

[51] Int. Cl.[6] .................................................. H01L 23/544
[52] U.S. Cl. .................................................. 257/797; 257/750
[58] Field of Search ........................ 257/797, 750, 257/632

[56] References Cited

U.S. PATENT DOCUMENTS

| | | | |
|---|---|---|---|
| 4,407,933 | 10/1983 | Fraser et al. | 430/296 |
| 4,529,685 | 7/1985 | Borodovsky | 430/311 |
| 4,614,433 | 9/1986 | Feldman et al. | 356/401 |
| 4,640,888 | 2/1987 | Itoh et al. | 430/323 |
| 5,237,199 | 8/1993 | Morita | 257/797 |
| 5,314,837 | 5/1994 | Barber et al | 257/797 |
| 5,481,362 | 1/1996 | Van Den Brink et al. | 356/401 |
| 5,640,053 | 6/1997 | Caldwell | 257/797 |

Primary Examiner—Mahshid D. Saadat
Assistant Examiner—S. V. Clark
Attorney, Agent, or Firm—Schmeiser, Olsen & Watts; Mark F. Chadurjian, Esq.

[57] ABSTRACT

Methods are disclosed that enhance the contrast between alignment targets and adjacent materials on a semiconductor wafer. According to a first embodiment, the TiN layer that is deposited during an earlier processing step is stripped away to enhance the reflectivity of the metal layer. According to a second embodiment, a reflective coating is added over the metal layer to enhance the reflectivity of the metal layer. According to a third embodiment, a reflective coating is added over the entire wafer to enhance the reflectivity of the metal layer. According to a fourth embodiment, an anti-reflective coating in a sandwich structure is added to reduce the reflectivity of the material adjacent the alignment targets. According to a fifth embodiment, an organic anti-reflective coating is added to reduce the reflectivity of the material adjacent the alignment targets. All of these embodiments result in a contrast between the alignment target and the adjacent material that is more consistent over variations in oxide thickness. The more uniform contrast makes it easier for the stepper system to identify the edges of the alignment targets, resulting in a more exact placement of the mask.

10 Claims, 6 Drawing Sheets

BU9-96-092

METHOD FOR IMPROVING VISIBILITY OF ALIGNMENT TARGETS IN SEMICONDUCTOR PROCESSING

BACKGROUND OF THE INVENTION

1. Technical Field

This invention generally relates to semiconductor processing, and more specifically relates to the alignment of a semiconductor wafer with a mask during processing.

2. Background Art

Today, our society is heavily dependent on high-tech electronic devices for everyday activity. Integrated circuits are the components that give life to our electronic devices. Integrated circuits are found in widespread use throughout the world, in appliances, in televisions and personal computers, and even in automobiles. Additionally, modern manufacturing and production facilities are becoming increasingly dependant on the use of machines controlled by integrated circuits for operational and production efficiencies. Indeed, in many ways, our everyday life could not function as it does without integrated circuits. These integrated circuits are manufactured in huge quantities in our country and abroad. Improved integrated circuit manufacturing processes have led to drastic price reductions and performance enhancements for these devices.

The traditional integrated circuit fabrication process is a series of steps during which a geometric pattern or set of geometric patterns is created to form an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers. The layers and regions are arranged to form electronic components or devices such as transistors, diodes, and capacitors. Thousands of these devices are formed essentially simultaneously on the surface of a single wafer of semiconductor material during processing.

The overall process of forming integrated circuits on the surface of wafers is heavily dependant on photo processing techniques such as photolithography. Each layer is formed using one or more masks that define areas of the semiconductor wafer that require processing during one or more subsequent steps. As the scale of integrated circuits continues to be reduced, the ability to align the mask to a precise position on the semiconductor wafer becomes more critical.

Alignment targets are well known in the art, and provide a way for a stepper machine to position a mask at the desired location above a semiconductor wafer. Alignment targets are typically formed of metal during the processing steps that define the geometric shapes in the first metal layer. The alignment targets typically have oxide surrounding the metal portion. The metal layer in the alignment targets is more reflective than the adjacent oxide, resulting in a contrast that may be optically detected by a machine that positions a mask above the semiconductor wafer. The contrast results from the difference in the reflectivity of the metal and the reflectivity of the adjacent oxide.

One factor that can severely affect the reflectivity of the region adjacent the alignment targets and of the metal layer that comprise the alignment targets is the thickness of the oxide. The alignment system typically uses a single wavelength illumination source that is sensitive to thin film interference effects caused by variations in the thickness of the oxide. The oxide may actually be stacked, with a first oxide layer fabricated during one step and one or more additional oxide layers fabricated on top of the first oxide layer during other steps. The reflectivity of the region surrounding the alignment target is a function of the thickness of the oxide in this region, while the reflectivity of the metal region that comprises the alignment target is also a function of the oxide overlying the alignment target. With variations in oxide thickness across a single wafer, from wafer to wafer, and from one batch of wafers to the next, the stepper machine that aligns the mask may see a wide variance in reflectivity (i.e., a large range of contrast). This variance in reflectivity may result in the stepper machine interpreting a variation in reflectivity caused by noise as an alignment target, resulting in improper positioning of the mask.

Other factors also result in varying contrast between alignment targets and the adjacent oxide. Referring now to FIG. 1, during a particular semiconductor process, a semiconductor wafer 100 comprises a substrate 110, a metal layer 120, a titanium nitride (TiN) layer 130, and a layer of photoresist 140. This structure is formed by depositing metal layer 120 over all of substrate 110 on the semiconductor wafer, then depositing TiN layer 130 over metal layer 120, then applying photoresist 140. A mask is then used to expose resist 140 to the desired pattern of light. Resist 140 is then developed, thereby removing portions of resist layer 140 where the metal layer is to be removed. An etching step is then used to remove TiN layer 130 and metal layer 120, resulting in a desired pattern of metal on the semiconductor wafer. This resultant pattern includes alignment targets to assure subsequent masks are properly aligned to the wafer.

The TiN layer 130 is an anti-reflective coating deposited atop metal layer 120. By providing an anti-reflective coating, less light is reflected back through the resist and toward the mask. As a result, the photoresist is more precisely patterned after applying the TiN layer 130 than was previously possible without applying the TiN layer 130. For a photoresist light source of 365 nm, using a TiN layer of 35 nm during the initial patterning of the first metal layer results in improved definition and accuracy in the metal layer. Next we examine the result of adding the TiN layer on subsequent processing steps.

Referring to FIG. 2, a structure 200 results after several processing steps are performed to the structure 100 of FIG. 1. As described above, the resist layer 140 on structure 100 is exposed through a mask, developed, and the underlying metal layers are etched, resulting in portions 240 that remain after etching. Next, an oxide layer is provided, and the entire structure is planarized to bring the top of oxide portions 210 to the same height as the top of metal portions 240. Next, another oxide layer 220 is deposited. At this point, resist 230 is placed on top of oxide 220 for the next patterning step. Another mask must be aligned to the semiconductor wafer, and alignment targets are used for this purpose. Note, however, that the light source for identifying the location of the alignment targets typically uses visible light, e.g., a wavelength of 633 nm. This light source is considerably different than light sources used to expose photoresist, which commonly have wavelengths of 248 nm, 365 nm, and 436 nm. For a 365 nm photoresist light source, the 35 nm layer of TiN that helped in the previous step of exposing the photoresist layer 100 of FIG. 1 is now negatively affecting the reflectivity of the metal layer. In essence, the anti-reflective TiN coating is partially reducing the natural reflectivity of the metal layer. The thicker the coating, the less reflective the metal layer appears. The metal layer contains the alignment targets, so the anti-reflective TiN coating that served a useful purpose in the initial formation of the first metal layer now makes it more difficult for a stepper machine to accurately align the next mask to the semiconductor wafer. Therefore, there exists a need to enhance the contrast between alignment targets and adjacent materials to assure more accurate positioning of a mask.

DISCLOSURE OF INVENTION

According to the present invention, methods are disclosed that enhance the contrast between alignment targets and adjacent materials. According to a first embodiment, the TiN layer that is deposited during an earlier processing step is stripped away to enhance the reflectivity of the metal layer. According to a second embodiment, a reflective coating is added over the metal layer to enhance the reflectivity of the metal layer. According to a third embodiment, a reflective coating is added over the entire wafer to enhance the reflectivity of the metal layer. According to a fourth embodiment, an anti-reflective coating in a sandwich structure is added to reduce the reflectivity of the material adjacent the alignment targets. According to a fifth embodiment, an organic anti-reflective coating is added to reduce the reflectivity of the material adjacent the alignment targets. All of these embodiments result in a contrast between the alignment target and the adjacent material that is more consistent over variations in oxide thickness. The more uniform contrast makes it easier for the stepper system to identify the edges of the alignment targets, resulting in a more exact placement of the mask.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

According to the present invention, various methods are disclosed that provide enhanced contrast between alignment targets and adjacent materials. By using any of the methods disclosed herein, more consistent ranges of reflectivity are obtained, resulting in a stepper system more easily identifying the edges of the alignment targets. As a result, masks are more precisely positioned, thereby improving the yield of the semiconductor wafer.

Figure 1:
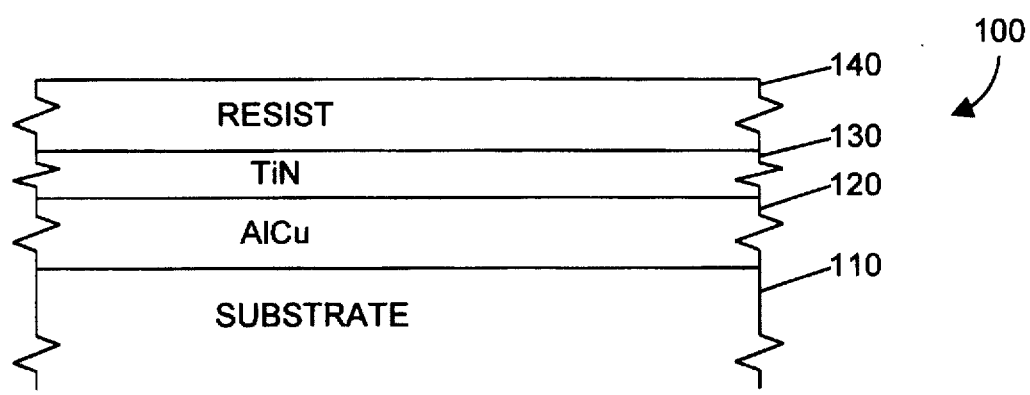
FIG. 1 is a partial cross-sectional view of a semiconductor wafer prior to patterning the first metal layer.
Figure 2:
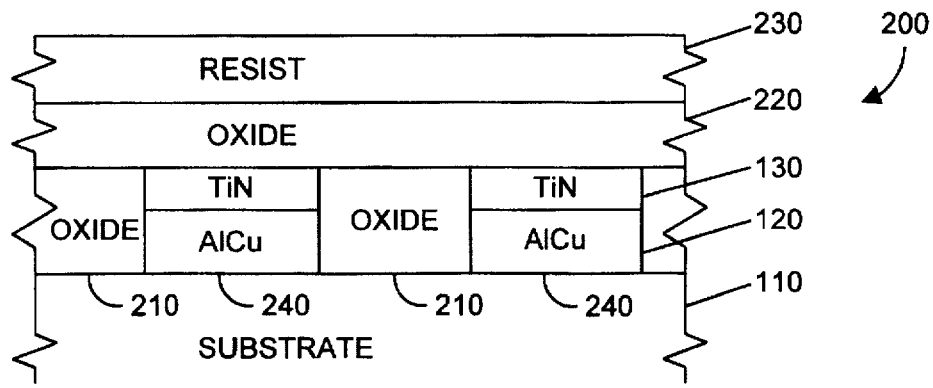
FIG. 2 is a partial cross-sectional view of the semiconductor wafer of FIG. 1 after several processing steps and before another patterning step.
Figure 3:
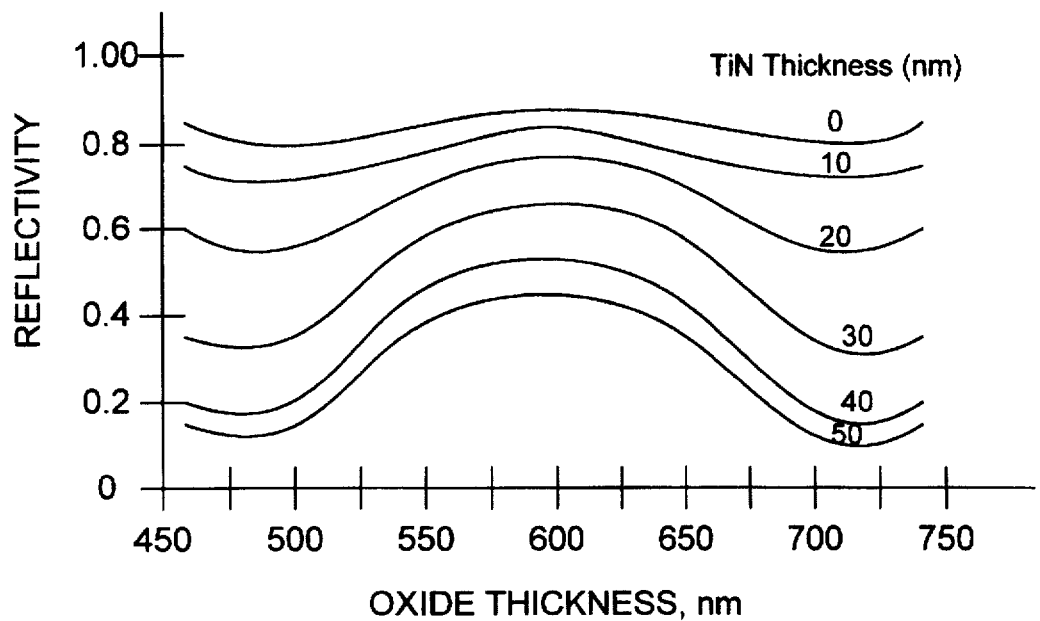
FIG. 3 is a graph showing the reflectivity of the metal portions as a function of oxide thickness with different thicknesses of TiN coatings.
Figure 4:
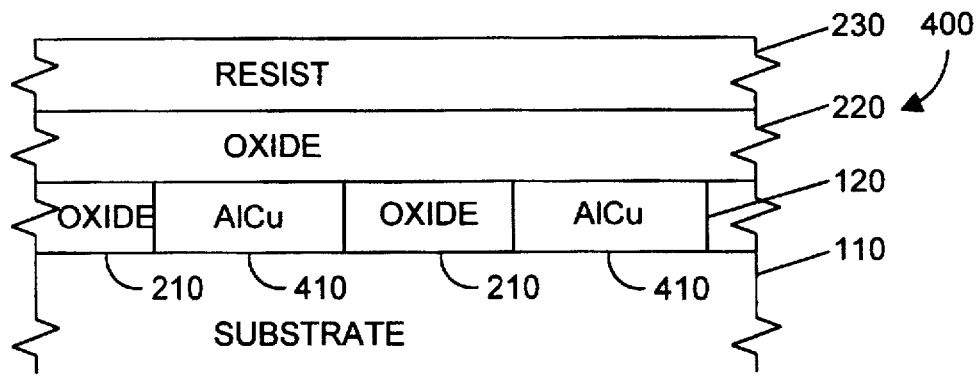
FIG. 4 is partial cross-sectional view of a semiconductor wafer that has the TiN layer removed in accordance with the first embodiment of the invention.

Referring to FIG. 4, a structure 400 in accordance with the first embodiment overcomes the problems associated with the TiN layer in structure 200 of FIG. 2 by stripping off the layer of TiN after patterning the metal layer. The TiN layer may be thinned or removed using any suitable method, including chemical etching and reactive ion etching (RIE). While the removal of the TiN layer adds an extra processing step, this is a very effective way to enhance the reflectivity of the metal layer, as shown by the graph of FIG. 3. By removing the TiN layer (TiN=0), the reflectivity of metal portions 410 is not only higher, but also much more consistent over variations in oxide thickness, as shown by the TiN=0 curve. However, complete removal of the TiN layer is not required to obtain enhanced reflectivity of the metal layer. By thinning the TiN layer to any degree, the reflectivity of the alignment targets is enhanced, as illustrated by the many curves in FIG. 3. The first embodiment expressly includes any thinning of the TiN layer, from very slight thinning to complete removal.

Figure 5:
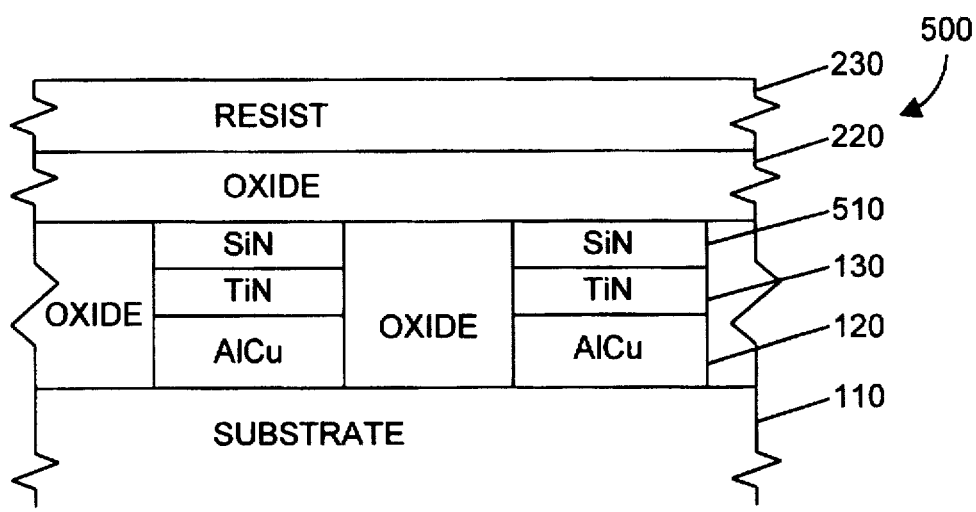
FIG. 5 is partial cross-sectional view of a semiconductor wafer that has a reflective SiN layer overlying the metal portions in accordance with a second embodiment of the invention.

Referring to FIG. 5, a structure 500 in accordance with the second embodiment has a silicon nitride (SiN) coating 510 overlying the metal portions of the wafer to enhance the reflectivity of the metal portions. This structure may be achieved by adding the SiN coating on the entire wafer before patterning the first metal layer. This SiN coating may be added using plasma enhanced chemical vapor deposition (PECVD). This coating, however, will prevent the metal layer from being etched away, so it must be removed in a separate step in the areas where the metal layer is to be etched away.

Figure 6:
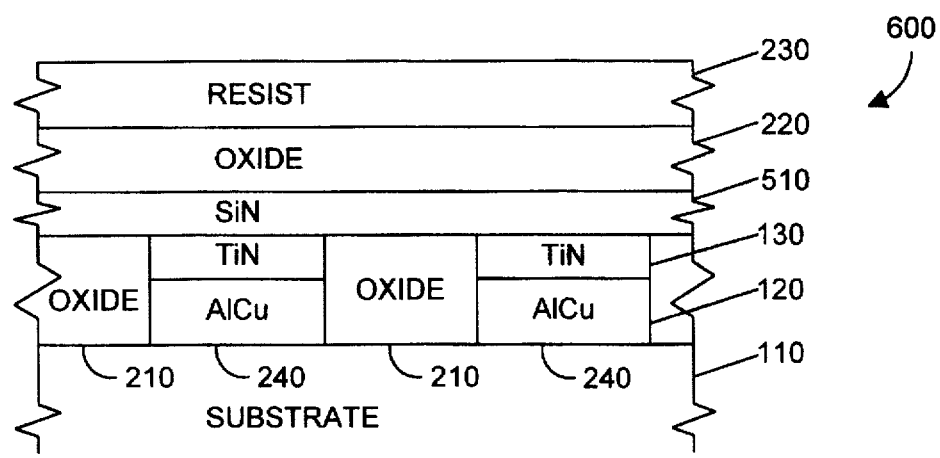
FIG. 6 is a partial cross-sectional view of a semiconductor wafer that has a reflective SiN layer overlying the entire wafer in accordance with a third embodiment of the invention.

Referring now to FIG. 6, a structure 600 in accordance with the third embodiment includes a SiN coating 510 that overlies the entire structure, both metal portions and adjacent materials as well. This structure is achieved by depositing the SiN coating after metal patterning, oxide deposition, and planarization of the wafer. While the SiN layer overlies both metal portions and adjacent oxide portions, its characteristics as a quarter-wave interference film enhance the reflectivity of the metal portions greater than for the oxide portions, resulting in a greater net contrast between the two.

Figure 7:
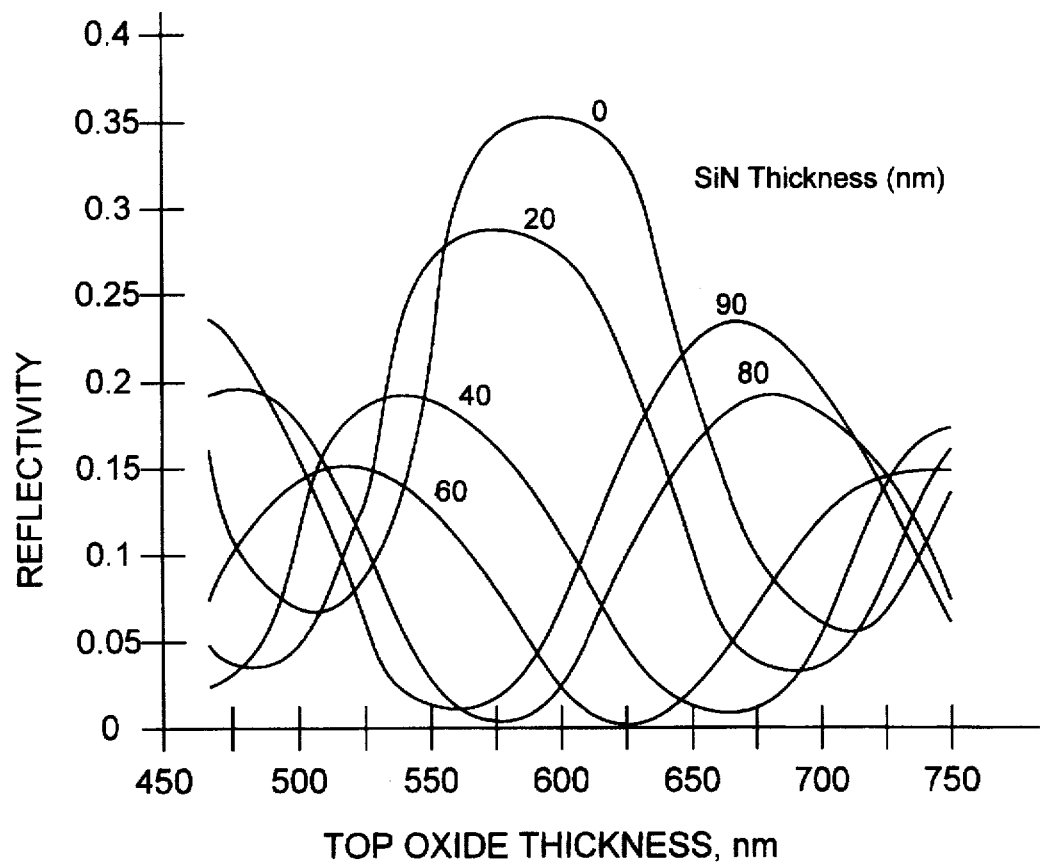
FIG. 7 is a graph showing the reflectivity of the oxide portions as a function of top oxide thickness for a variety of thicknesses of the SiN layer.

For the second and third embodiments disclosed herein, the thickness of the SiN layer may vary, and may be determined empirically for each specific process. The preferred thickness would minimize the peak-to-peak variation in reflectivity for the oxide portions with respect to oxide thickness. For the process described herein, the graph of FIG. 7 illustrates that the curve with the lowest peak-to-peak amplitude (yielding the lowest variability in reflectivity) occurs with a SiN thickness of approximately 60 nm.

Figure 8:
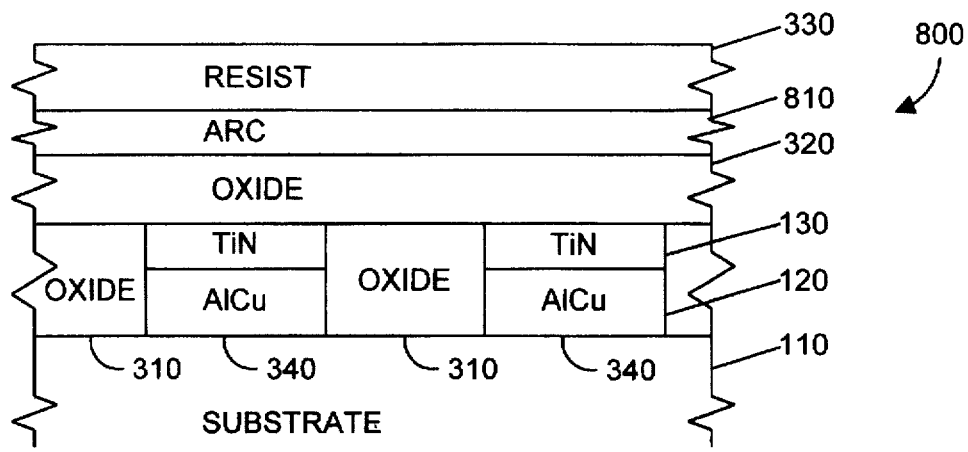
FIG. 8 is a partial cross-sectional view of a semiconductor wafer that has an anti-reflective coating (ARC) overlying the entire wafer in accordance with fourth and fifth embodiments of the invention.
Figure 9:
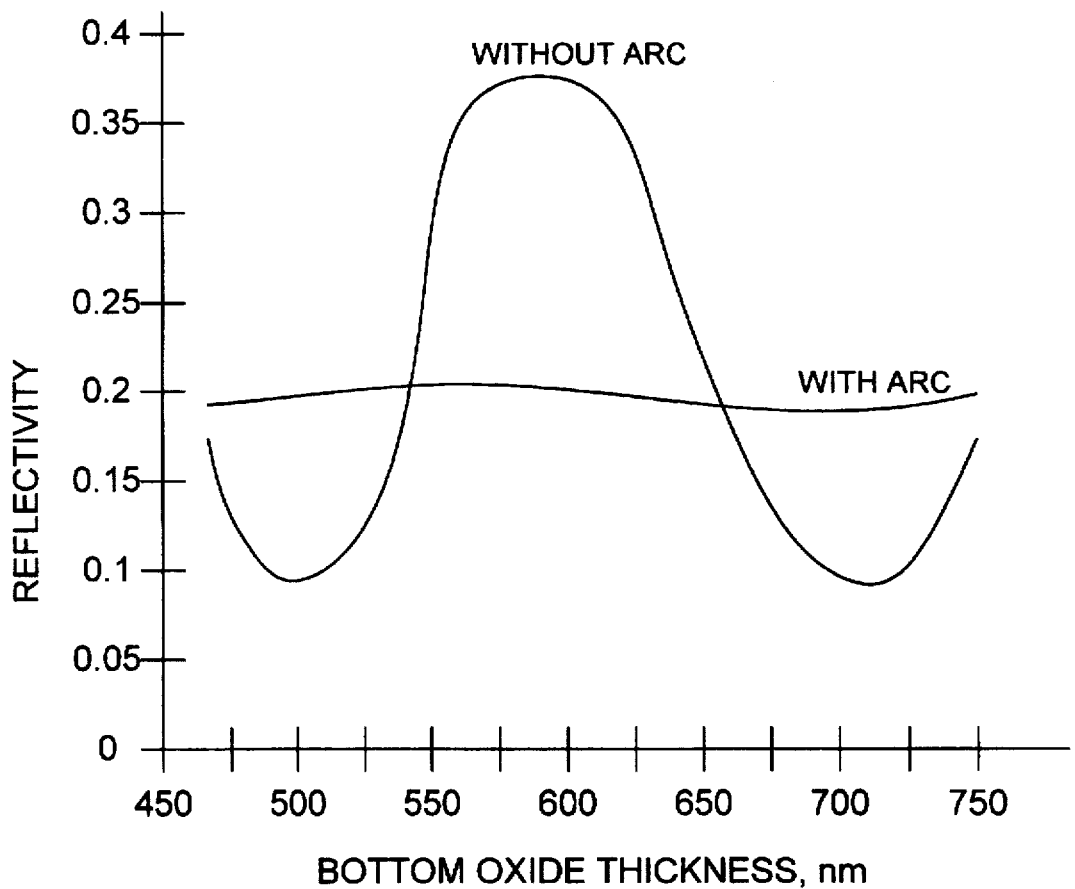
FIG. 9 is a graph showing the improvement in reflectivity obtained by adding an ARC in a sandwich structure in accordance with the fourth embodiment of the invention.

Referring to FIG. 8, a structure 800 in accordance with fourth and fifth embodiments of the invention includes an anti-reflective coating (ARC) 810 that is deposited between the second oxide layer 220 and the resist layer 230. This ARC is preferably index-matched to the oxide (i.e., has a lower refractive index than the oxide). For an alignment illumination source with a wavelength of 633 nm and oxides with refractive indexes between 1.45 and 1.55, an ARC refractive index of 1.38 to 1.42 would be suitable. According to the fourth embodiment, the ARC 810 comprises a high index/low index film stack (such as $Si_3N_4/SiO_2$) in ratios and thicknesses that provide a quarter-wave interference film. The graph of FIG. 9 illustrates the improvement in variability of reflectivity with the ARC present over the case that has no ARC.

Figure 10:
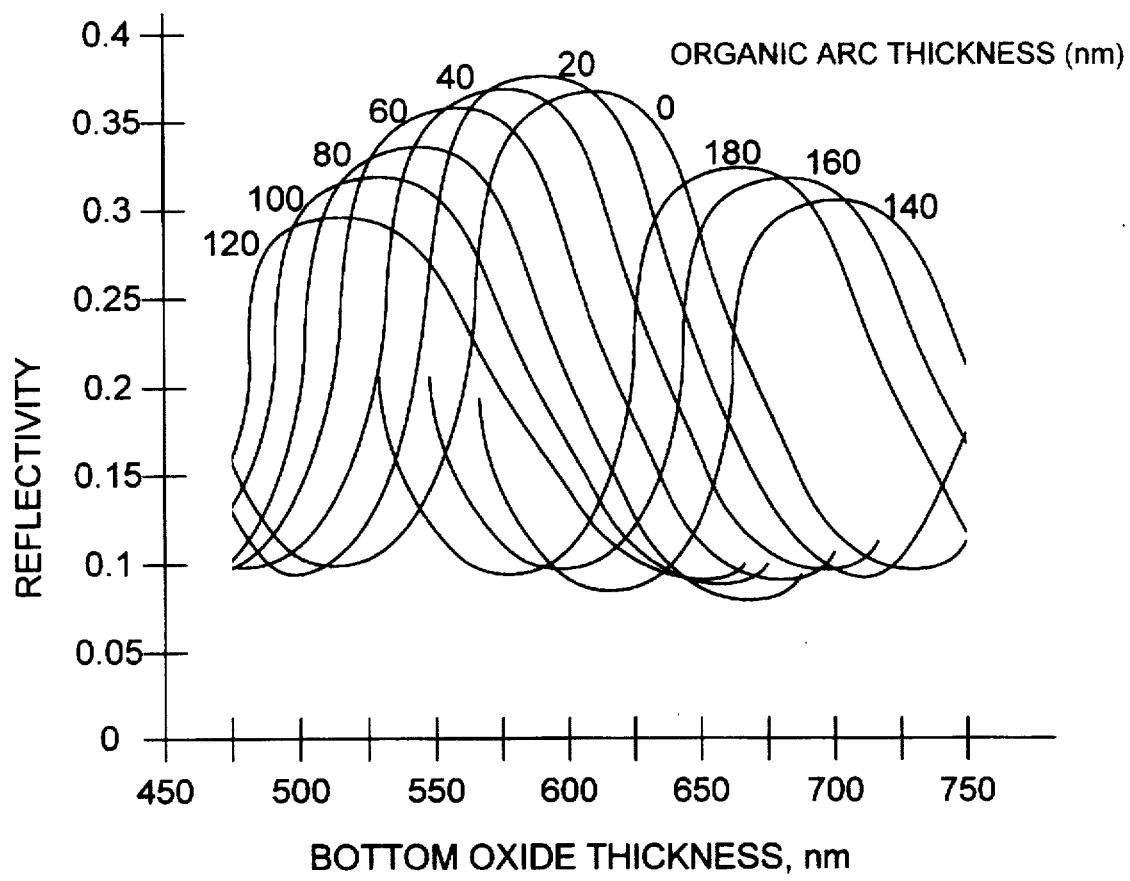
FIG. 10 is a graph showing the improvement in reflectivity obtained by adding an organic ARC in accordance with the fifth embodiment of the invention.

According to the fifth embodiment, the ARC 810 comprises an organic material. Suitable organic materials include fluorinated poly(arylethers) and perfluorocyclobutane aromatic ether polymers, but other materials may be used within the scope of the present invention to obtain a quarter-wave interference film that reduces the variation in reflectivity in the oxide regions. The thickness of the organic ARC layer will vary according to the exact material used and the specific process. Referring to FIG. 10, for the process disclosed herein using either of the two types of organic ARC substances disclosed herein, a thickness of 120 nm results in a minimum peak-to-peak variation in reflectivity, and is therefore the preferred thickness of ARC 810.

The methods disclosed herein reduce the variability in contrast between alignment targets and their adjacent materials with variations in oxide thickness. Specifically, various coatings may be added to either enhance the reflectivity of the metal portion, reduce the reflectivity of the adjacent portions, or reduce the variation in reflectivity. By providing lower variability in contrast, a stepper system may more efficiently recognize the edges of the alignment targets, resulting in more precise placement of the mask relative to the semiconductor wafer.

While the invention has been particularly shown and described with reference to preferred embodiments thereof, it will be understood by those skilled in the art that various changes in form and details may be made therein without departing from the spirit and scope of the invention.

We claim:

1. A semiconductor device comprising:
   at least one alignment target, wherein the at least one alignment target has a reflectivity that is different from the reflectivity of material adjacent the at least one alignment target; and
   a coating layer on the semiconductor wafer comprising a quarter-wave interference film.

2. The semiconductor device of claim 1 wherein the at least one alignment target comprises a geographic pattern in a metal layer on the semiconductor wafer and wherein the adjacent material comprises an insulator.

3. The semiconductor device of claim 2 wherein the insulator comprises an oxide.

4. The semiconductor device of claim 1 wherein the film comprises a reflective coating of silicon nitride.

5. The semiconductor device of claim 1 wherein the film overlies the at least one alignment target.

6. The semiconductor device of claim 1 wherein the film additionally overlies the adjacent material.

7. The semiconductor device of claim 1 wherein the adjacent material comprises an oxide with a refractive index between 1.45 and 1.55, and wherein the film comprises an anti-reflective coating with a refractive index from 1.38 to 1.42.

8. The semiconductor device of claim 7 wherein the anti-reflective coating comprises a composite film of alternating layers of silicon nitride and oxide.

9. The semiconductor device of claim 7 wherein the anti-reflective coating comprises a fluorinated poly (arylether).

10. The semiconductor device of claim 7 wherein the anti-reflective coating comprises a perfluorocyclobutane aromatic ether polymer.

* * * * *